United States Patent [19]

Sakamoto et al.

[11] Patent Number: 4,801,904
[45] Date of Patent: Jan. 31, 1989

[54] CHIP-LIKE LC FILTER

[75] Inventors: Yukio Sakamoto; Shinichi Madokoro; Shingo Okuyama, all of Nagaokakyo, Japan

[73] Assignee: Murata Manufacturing Co., Ltd., Japan

[21] Appl. No.: 1,702

[22] Filed: Jan. 9, 1987

[30] Foreign Application Priority Data

Jan. 14, 1986 [JP] Japan ................................. 61-3537
Jan. 29, 1986 [JP] Japan ................................ 61-12375
Jun. 27, 1986 [JP] Japan ................................ 61-99405

[51] Int. Cl.$^4$ ......................... H01P 1/20; H01P 1/215
[52] U.S. Cl. .................................... 333/182; 333/183; 333/184; 333/185; 361/302; 439/607; 439/620
[58] Field of Search ............... 333/182, 183, 184, 185; 361/302; 439/607, 620

[56] References Cited

U.S. PATENT DOCUMENTS

| 2,111,710 | 3/1938 | Van Loon | 333/182 |
| 2,973,490 | 2/1961 | Schlicke | 333/182 |
| 3,546,638 | 12/1970 | Park | 333/182 |
| 3,548,347 | 12/1970 | Miller et al. | 333/182 |
| 3,597,711 | 8/1971 | Buckley | 333/183 |
| 4,079,343 | 3/1978 | Nijman | 333/185 X |
| 4,109,292 | 8/1978 | Shibayama et al. | 361/302 X |
| 4,262,268 | 4/1981 | Shimada et al. | 361/302 X |
| 4,320,364 | 3/1982 | Sakamoto et al. | 333/167 |
| 4,458,220 | 7/1984 | Carter et al. | 333/183 X |
| 4,746,557 | 5/1988 | Sakamoto et al. | 333/184 |
| 4,758,808 | 7/1988 | Sasaki et al. | 333/185 |

FOREIGN PATENT DOCUMENTS

| 1616793 | 9/1970 | Fed. Rep. of Germany | 333/182 |
| 2037489 | 7/1980 | United Kingdom | 361/400 |
| 2153165 | 8/1985 | United Kingdom | 333/185 |

Primary Examiner—Eugene R. Laroche
Assistant Examiner—Benny Lee
Attorney, Agent, or Firm—Ostrolenk, Faber, Gerb & Soffen

[57] ABSTRACT

A chip-like LC filter which comprises a cylindrical magnetic element having a through hole, a cylindrical capacitor element having a through hole and terminal electrodes formed on inner and outer peripheral surfaces thereof, and a central conductor inserted in the through holes of the magnetic element and the capacitor element aligned in the axial direction. The terminal electrode on the inner peripheral side of the capacitor element is electrically connected with the central conductor. Flange-shaped external terminal members are respectively provided on both end portions of the central conductor, so that the magnetic element and the capacitor element are located between the external terminal members.

13 Claims, 7 Drawing Sheets

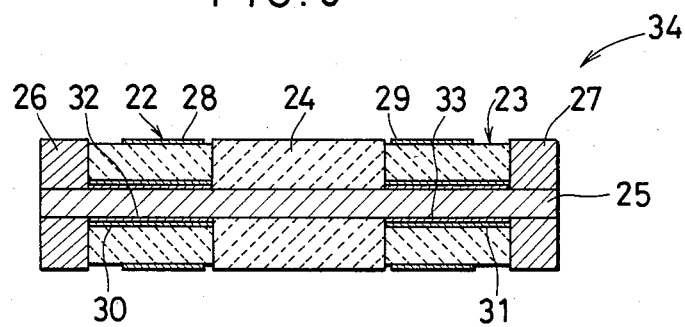
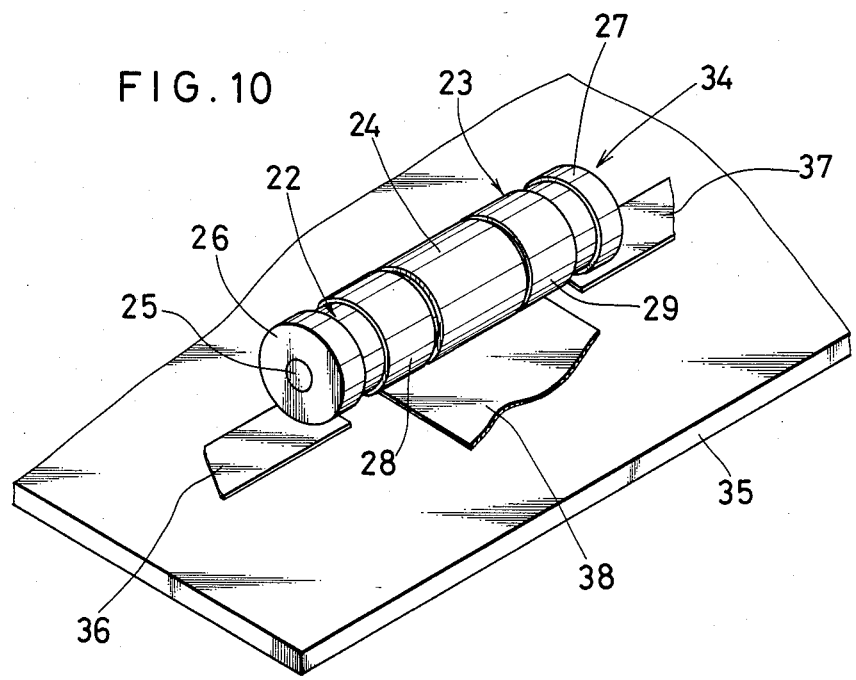

F I G. 14
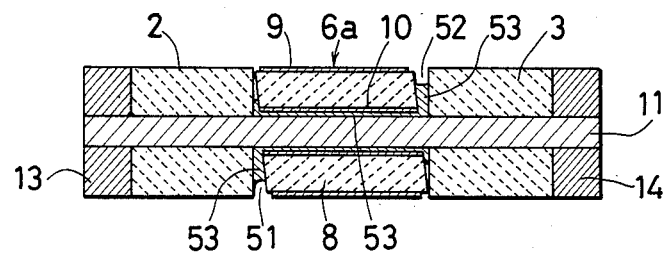
F I G. 15
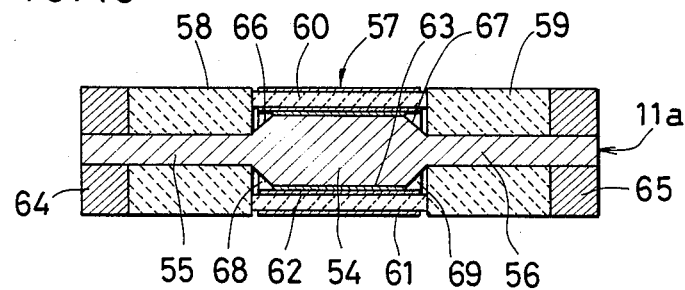
F I G. 16
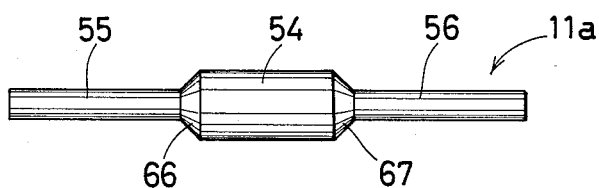
F I G. 17
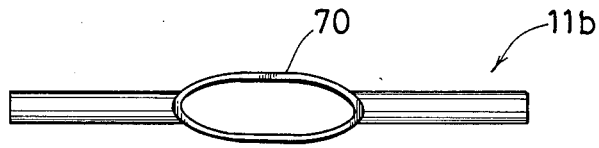

CHIP-LIKE LC FILTER

BACKGROUND OF THE INVENTION

1. Field of the Invention

The present invention relates to a chip-like LC filter, and more particularly, it relates to a chip-like LC filter which is applicable to a noise filter, for example.

2. Description of the Prior Art

In general, a filter device for filtering high frequency noise signals comprises at least one inductance element and at least one capacitor element. For example, U.S. Pat. No. 4,320,364 granted to Sakamoto et al. and issued on Mar. 16, 1982 discloses the structure of such an LC filter treated as one electronic component.

The U.S. Pat. No. 4,320,364 discloses various embodiments, and FIG. 16 thereof concretely shows the structure of a so-called T-type filter circuit formed as a single electronic component comprising one capacitor element and two inductance elements. In this structure, a pair of opposite capacitor electrodes are provided on both major opposite surfaces of a dielectric plate to form a capacitor element. A substantially U-shaped input/output lead line is soldered to one of the electrodes, and both legs thereof are inserted in ferrite bead members respectively. A ground lead line is soldered to the other capacitor electrode.

Such an LC filter is formed as an electronic component having three lead lines in consequence. In order to mount the LC filter on, e.g., a printed circuit board, the three lead lines are inserted in holes provided in the printed circuit board respectively, to be soldered to respective conductive patterns provided on the printed circuit board.

However, the LC filter having the aforementioned structure is so difficult to manufacture that the assembly operation thereof is complicated. Further, since a dielectric plate having a relatively wide major surface is employed, it is difficult to reduce the size of the electronic component, so mounting density on the printed circuit cannot be substantially improved. Further, mounting of the LC filter is complicated since the same is mounted on the printed circuit board by its lead lines. In addition, the LC filter is connected to a ground conductive pattern of the printed circuit board through a ground lead line, whereby undesired inductance components are generated on the ground lead line. Thus, the effect of noise elimination is lowered and excellent filter characteristics cannot be obtained.

SUMMARY OF THE INVENTION

Accordingly, an object of the present invention is to provide an LC filter which can be easily assembled.

Another object of the present invention is to provide a chip-like LC filter having no lead lines, which can be easily mounted on a printed circuit board.

Still another object of the present invention is to provide a chip-like LC filter which can improve mounting density on a printed circuit board.

A further object of the present invention is to provide an LC filter having excellent filter characteristics.

A chip-like LC filter according to the present invention comprises at least one magnetic element for forming an inductance element. The magnetic element has a first through hole extending along the axial direction thereof. The LC filter further comprises at least one capacitor element. The capacitor element is provided with a first terminal electrode on the outer peripheral surface thereof as well as a second through hole extending along the axial direction thereof. A second terminal electrode is formed on the inner peripheral surface defining the second through hole. A central conductor is inserted through the first and second through holes in order to retain the magnetic element and the capacitor element in an axially aligned state. The second terminal electrode of the capacitor element is electrically connected with the central conductor. First and second external terminal means are provided on respective end portions along the longitudinal direction of the central conductor respectively.

A chip-like LC filter that requires no lead line can be obtained by the present invention. Therefore, the LC filter can be directly mounted to conductive patterns provided on a printed circuit board or the like by the first terminal electrode of the capacitor element and the first and second external terminal means. Thus, there is no need to provide holes in the circuit board or insert lead lines in such holes in order to mount the LC filter on the circuit board. In the chip-like LC filter according to the present invention, however, lead lines may be added for serving as an external connection terminal to the first terminal electrode of the capacitor element and the first and second external terminal means provided on the respective end portions of the central conductor.

According to the present invention, the first terminal electrode of the capacitor element can be directly electrically connected to the ground pattern of the circuit board by soldering or the like, whereby the portion thus connected can be prevented from generating undesired inductance components, to effectively remove noise components. Thus, an LC filter having excellent filter characteristics can be obtained.

In addition, the magnetic element and the capacitor element are both arranged on the central conductor inserted through the magnetic element and the capacitor element, whereby the entire LC filter can be reduced in size to improve mounting density on the circuit board.

These and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a longitudinal sectional view of a chip-like LC filter according to still another embodiment of the present invention;

FIG. 10 is a perspective view showing an example of how the filter as shown in FIG. 9 may be mounted on a circuit board;

FIG. 14 is a longitudinal sectional view of a chip-like LC filter according to a further embodiment of the present invention;

FIG. 15 is a longitudinal sectional view of a chip-like LC filter according to a further embodiment of the present invention;

FIG. 16 is a front elevational view showing only the central conductor of the embodiment as shown in FIG. 15;

FIG. 17 is a front elevational view showing a modification of the central conductor employed in the embodiment as shown in FIG. 15;

DESCRIPTION OF THE PREFERRED EMBODIMENTS

Figure 1:
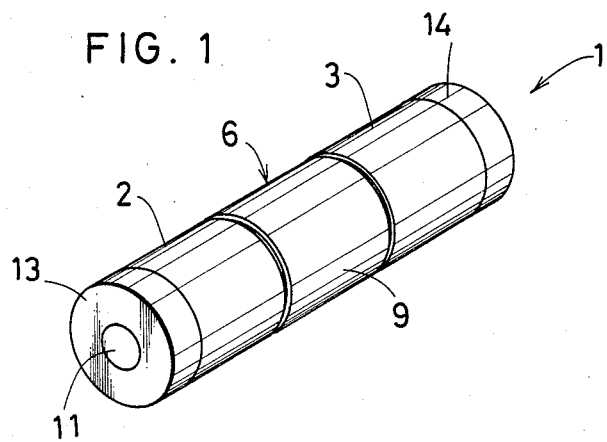
FIG. 1 is a perspective view of a chip-like LC filter according to an embodiment of the present invention.
Figure 2:
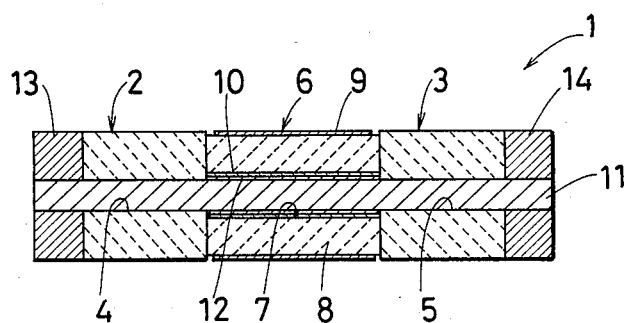
FIG. 2 is a longitudinal sectional view of the filter as shown in FIG. 1.
Figure 3:
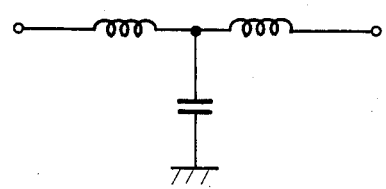
FIG. 3 illustrates an equivalent circuit obtained by the filter as shown in FIG. 1.

FIGS. 1 and 2 illustrate a chip-like LC filter 1 according to an embodiment of the present invention, which is adapted to form a so-called T-type filter circuit as shown in FIG. 3. To form this type of circuit, the chip-like LC filter 1 comprises two inductance elements and a capacitor element. In the structure concretely shown in FIGS. 1 and 2, the two inductance elements are formed by magnetic elements 2 and 3 which here are, e.g., cylindrical ferrite beads. The magnetic elements 2 and 3 are provided with axially extending through holes 4 and 5. The single capacitor element is formed by a cylindrical capacitor 6, which comprises a cylindrical dielectric member 8 having an axially extending through hole 7. A first terminal electrode 9 is formed on the outer peripheral surface of the dielectric member 8. A second terminal electrode 10 is formed on the inner peripheral surface defining the through hole 7. In this embodiment, the first terminal electrode 9 and the second terminal electrode 10 are opposite to each other, to form electrostatic capacitance between them. The first terminal electrode 9 is preferably formed to leave margins on both edges of the radially outer peripheral surface of the dielectric member 8.

In order to retain the magnetic elements 2 and 3 and the cylindrical capacitor 6 in an axially aligned state, a central conductor 11 of conductive material such as metal is inserted in the through holes 4, 5 and 7. In this embodiment, the through holes 4, 5 and 7 are circular in section respectively while the central conductor 11 is in the form of a rod with a circular cross section. The second terminal electrode 10 of the cylindrical capacitor 6 is electrically connected to the central conductor 11 by solder 12, for example.

With the magnetic element 2, the cylindrical capacitor 6 and the magnetic element 3 arranged in sequence on the central conductor 11 as shown in FIGS. 1 and 2, both end portions of the central conductor 11 project from the magnetic elements 2 and 3 respectively. The projecting portions are fitted into first and second ring-shaped members 13 and 14 of conductive material such as metal for serving as first and second external terminal means respectively. In more concrete terms, the first and second ring-shaped members 13 and 14 are mechanically fixed to the central conductor 11 by means such as caulking or soldering while being electrically connected to the same. The first and second ring-shaped members 13 and 14 define flange-shaped portions on both ends of the central conductor 11, thereby to serve also as stop means for preventing the magnetic elements 2 and 3 or the cylindrical capacitor 6, before being soldered to the central conductor 11, from being displaced from the central conductor 11.

The first terminal electrode 9 provided on the outer peripheral surface of the cylindrical capacitor 6 is formed to leave margins on both edges of the said outer peripheral surface as hereinabove described. This prevents solder for connecting the second terminal electrode 10 with the central conductor 11 which may fill in the clearances between both end surfaces of the cylindrical capacitor 6 and the end surfaces of the magnetic elements 2 and 3 by a capillary phenomenon when assembled as in FIGS. 1 and 2 for example, from shorting the first and second terminal electrodes 9 and 10, by virtue of the aforementioned margins. Also, in a case where the magnetic elements 2 and 3 are formed of a relatively conductive material, the first and second terminal electrodes 9 and 10 are prevented from being shorted by the magnetic elements 2 and 3 by virtue of the said margins.

Figure 4:
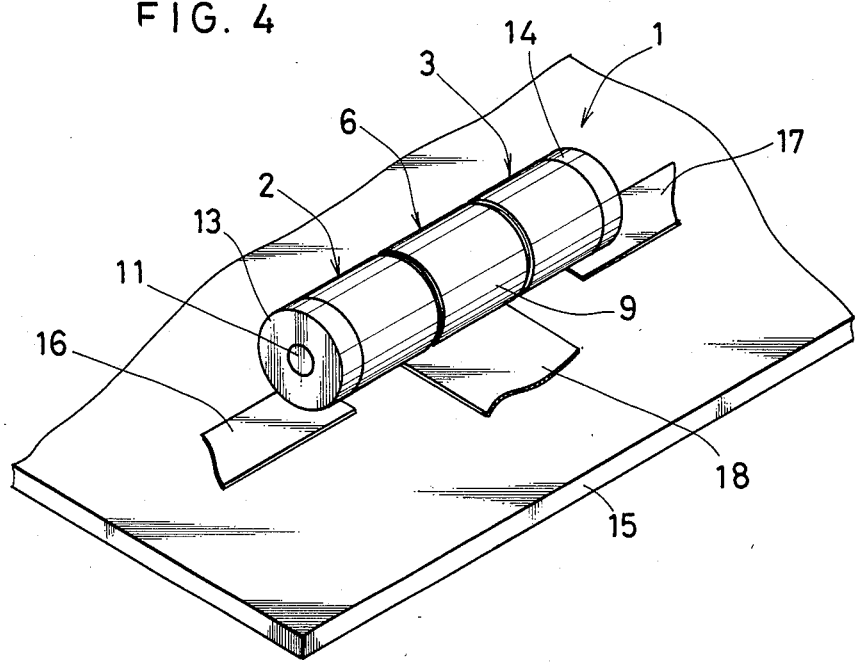
FIG. 4 is a perspective view showing an example of how the filter as shown in FIG. 1 may be mounted on a circuit board.

FIG. 4 illustrates an example of how the chip-like LC filter 1 may be mounted. A substrate 15 such as a printed circuit board is provided on its one surface with a pair of input/output conductive patterns 16 and 17 and a ground conductive pattern 18, as partially shown in FIG. 4. The first terminal electrode 9 and the first and second ring-shaped members 13 and 14 of the chip-like LC filter 1 have outer peripheral surfaces aligned substantially in the same plane as shown in FIG. 2, for example. Therefore, when the LC filter 1 is placed on the substrate 15 as shown in FIG. 4, the first ring-shaped member 13 comes into contact with the conductive pattern 16 and the second ring-shaped member 14 comes into contact with the conductive pattern 17 while the first terminal electrode 9 comes into contact with the conductive pattern 18. Solder (not shown) or the like may be applied to such respective contact portions to make the desired connections. Assuming that the conductive pattern 16 is in the input side of a signal line, the signal flows from the conductive pattern 16, to the conductive pattern 17 in the output side, through the first ring-shaped member 13, the central conductor 11 and the second ring-shaped member 14. Undesired noise components superimposed on such a signal line are eliminated by passing through the first terminal electrode 9 of the cylindrical capacitor 6 to the ground conductive pattern 18. In this case, the chip-like LC filter 1 serves as a noise filter.

The LC filter 1 can be soldered to the substrate 15 simultaneously with other electronic components (not shown) to be mounted on the substrate 15. Specifically, the LC filter 1 and other components may be provisionally fixed to the substrate 15 by an adhesive agent or the like and then dipped in a molten solder tank, thereby to simultaneously solder the plurality of electronic components to the substrate 15.

Figure 5:
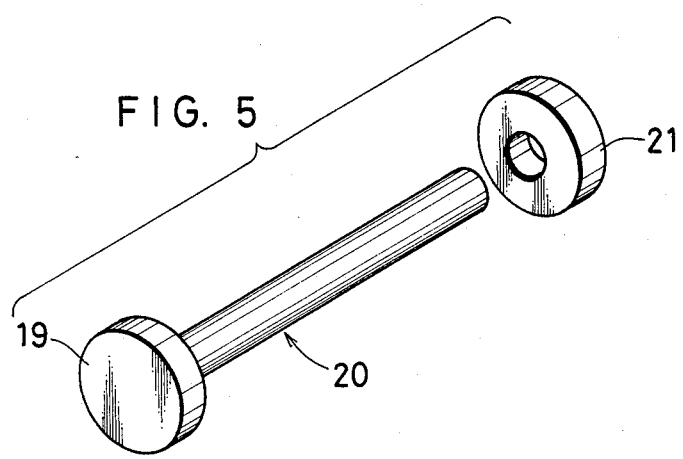
FIG. 5 is a perspective view showing modifications of the central conductor and first and second external terminal means in the embodiment as shown in FIG. 1.

The central conductor 11 and the first and second ring-shaped members 13 and 14 in the aforementioned embodiment may be replaced by a central conductor 20 integrally provided with a flange 19 and a single ring-shaped member 21, as shown in FIG. 5. In this case, the flange 19 and the ring-shaped member 21 respectively serve as the first and second ring-shaped members 13 and 14 of the aforementioned embodiment. The ring-shaped member 21 is fixed to the central conductor 20 by a method similar to the method of fixing the first or second ring-shaped member 13 or 14 to the central conductor 11.

Figure 6:
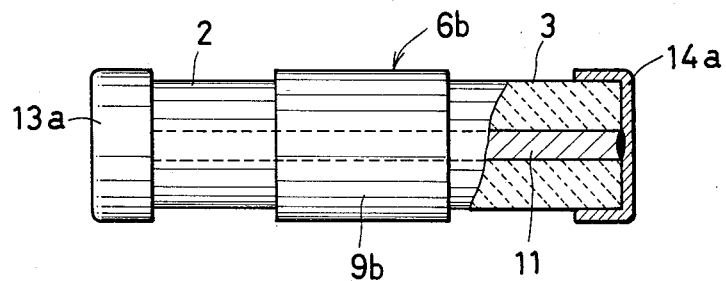
FIG. 6 is a partially fragmented front elevational view showing a chip-like LC filter according to another embodiment of the present invention.

FIG. 6 illustrates another embodiment of the invention which includes still another example of the external terminal means. Referring to FIG. 6, elements corresponding to those included in the embodiment as shown in FIGS. 1 and 2 are indicated by the same reference numerals, thereby to avoid redundant description.

The embodiment as shown in FIG. 6 is characterized in that first and second cap-shaped members 13a and 14a are employed in place of the first and second ring-shaped members 13 and 14. The cap-shaped members 13a and 14a are formed of conductive material such as metal, and connected to a central conductor 11 by resistance welding, for example. The cap-shaped members 13a and 14a are arranged to partially cover the elements provided on the respective end portions of the central conductor 11, i.e., magnetic elements 2 and 3. Accordingly, a cylindrical capacitor 6b is provided which is larger in diameter than the magnetic elements 2 and 3, so that its size corresponds to the thickness of the cap-shaped members 13a and 14a, whereby an outer terminal electrode 9b of the cylindrical capacitor 6b defines an outer peripheral surface aligned substantially in the same plane with the outer peripheral surfaces of the cap-shaped members 13a and 14a.

Figure 7:
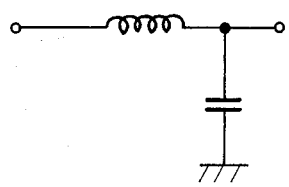
FIG. 7 illustrates an equivalent circuit, namely a so-called L-type LC filter.

FIG. 7 shows an equivalent circuit, namely a so-called L-type LC filter. In order to implement such an L-type LC filter, although not shown, either the magnetic element 2 or 3 may be omitted, while reducing the length of the central conductor 11, in the embodiment as shown in FIGS. 1 and 2.

Figure 8:
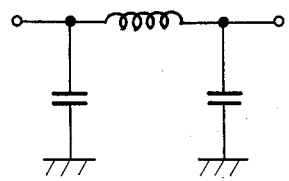
FIG. 8 illustrates an equivalent circuit of the so-called $\pi$-type LC filter.

FIG. 8 shows an equivalent circuit namely a so-called π-type LC filter. In order to implement such a π-type filter, a single inductance element may be combined with two capacitor elements. FIG. 9 illustrates an example of such structure.

Referring to FIG. 9, a magnetic element 24 is provided between first and second cylindrical capacitors 22 and 23. The cylindrical capacitors 22 and 23 and the magnetic element 24 are respectively provided with through holes, and a central conductor 25 is arranged to pass through the through holes. Both end portions of the central conductor 25 are fitted into first and second ring-shaped members 26 and 27 serving as first and second external terminal means.

First terminal electrodes 28 and 29 are formed on respective outer peripheral surfaces of the first and second cylindrical capacitors 22 and 23. Second terminal electrodes 30 and 31 are formed on respective inner peripheral surfaces of the first and second cylindrical capacitors 22 and 23 defining the through holes. The second terminal electrodes 30 and 31 are electrically connected to the central conductor 25 respectively by solder layers 32 and 33, for example.

Relatively wide gaps are defined between the first terminal electrodes 28 and 29 formed on the respective outer peripheral surfaces of the cylindrical capacitors 22 and 23, and the ring-shaped members 26 and 27 respectively, so that the ring-shaped members 26 and 27 are not electrically connected with the terminal electrodes 28 and 29 respectively.

A chip-like LC filter 34 as shown in FIG. 9 is mounted on a substrate 35 as shown in FIG. 10, for example. The substrate 35 is provided on its one surface with a pair of input/output conductive patterns 36 and 37 and a ground conductive pattern 38. The first ring-shaped member 26 is connected with the conductive pattern 36 and the second ring-shaped member 27 is connected with the conductive pattern 37 while both of the terminal electrodes 28 and 29 are connected with the conductive pattern 38 by solder (not shown) or the like.

FIGS. 11 and 12, 13 and 14 illustrate further embodiments of the present invention respectively. In each of the said embodiments, clearances for partially exposing a central conductor are positively defined at least partially adjacent to at least one of the end surfaces of a capacitor element in order to facilitate soldering of a terminal electrode provided in the inner peripheral side of the capacitor element to the central conductor. These embodiments are substantially similar to the embodiment as shown in FIG. 2, and hence corresponding portions are indicated by the same reference numerals to avoid redundant description.

Figure 11:
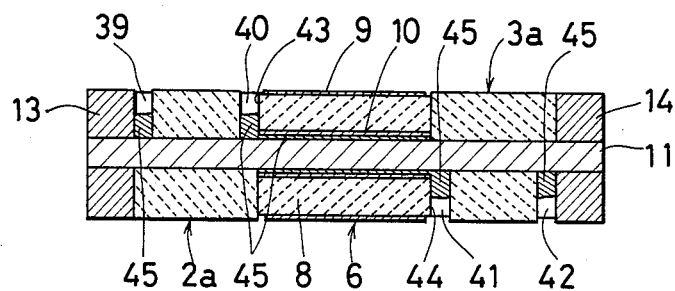
FIG. 11 is a longitudinal sectional view of a chip-like LC filter according to a further embodiment of the present invention.
Figure 12:
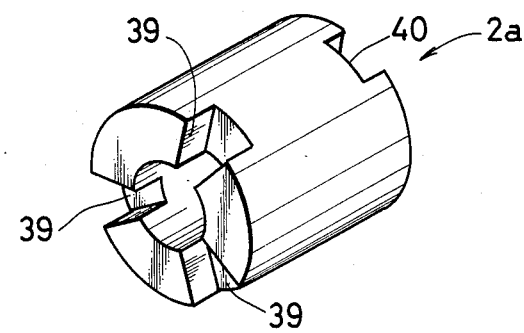
FIG. 12 is a perspective view showing the appearance of a magnetic element employed in the embodiment as shown in FIG. 11.

An important feature of the embodiment as shown in FIGS. 11 and 12 resides in the configuration of magnetic elements 2a and 3a. As seen in FIG. 12, which shows a perspective view of one magnetic element 2a, at least one notch, and in this case three notches 39 or 40 are provided in each end surface of the magnetic element 2a. The other magnetic element 3a is also provided with notches 41 and 42 (FIG. 11). The LC filter of this embodiment is assembled as shown in FIG. 11 with such magnetic elements 2a and 3a, so that clearances for partially exposing the central conductor 11 are defined in parts adjacent to both end surfaces 43 and 44 of the cylindrical capacitor 6 respectively. Therefore, solder 45 applied to fill the notches 40 and 41 in particular smoothly flows into the clearnces beetweeen the terminal electrode 10 provided in the inner peripheral side of the cylindrical capacitor 6 and the central conductor 11, to readily and reliably attain electrical connection of the terminal electrode 10 and the central conductor 11.

The aforementioned solder 45 may be applied by provisionally arranging the magnetic elements 2a and 3a and the cylindrical capacitor 6 between first and second ring-shaped members 13 and 14 on the central conductor 11 and dipping the assembly in a molten solder tank. In this case, the first and second ring-shaped members 13 and 14 can be simultaneously connected with the central conductor 11 by the solder 45. Further, when the magnetic elements 2a and 3a, the cylindrical capacitor 6, the first and second terminal electrodes 9 and 10 and the central conductor 11 are provisionally fixed in a mechanical manner, even if the same are not yet soldered, the assembly may be provisionally fixed on the substrate 15 as shown in FIG. 4, for example through an adhesive agent or the like. Then the assembly and the substrate may be dipped in a molten solder tank, to apply the solder 45 as shown in FIG. 11, simultaneously with soldering the elements 9, 13 14 to the conductive patterns 16 to 18.

Figure 13:
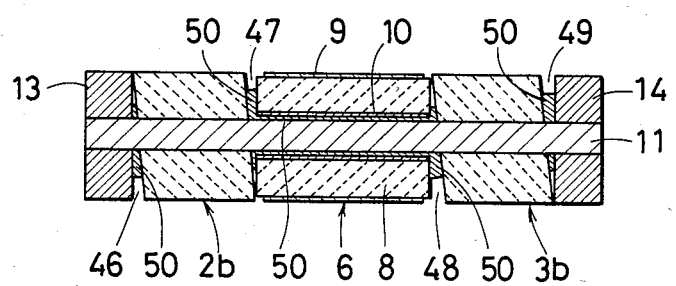
FIG. 13 is a longitudinal sectional view of a chip-like LC filter according to a further embodiment of the present invention.

FIG. 13 shows an embodiment in which both end portions of magnetic elements 2b and 3b are formed with inclined surfaces thereby to define notches 46 to 49 respectively. Similarly to the aforementioned notches 39 to 41 (FIG. 11), these notches 46 to 49 also facilitate smooth flowing of solder 50 into clearances between a terminal electrode 10 in the inner peripheral side of a cylindrical capacitor 6 and a central conductor 11.

In the embodiment as shown in FIG. 14, both end surfaces of a cylindrical capacitor 6a are inclined thereby to define notches 51 and 52. The notches 51 and 52 also enable smooth flowing of solder 53 in clearances between a terminal electrode 10 in the inner peripheral side of the cylindrical capacitor 6a and a central conductor 11.

In order to facilitate smooth flowing of the solder 45, 50 or 53 into the clearances between the terminal electrode 10 and the central conductor 11, the clearances for partially exposing the central conductor may be provided in a part adjacent to at least one of the end surfaces of the cylindrical capacitor. Therefore, the embodiment as shown in FIG. 11 may be merely provided with either the notch 40 or 41 and the embodiment as shown in FIG. 13 may be merely provided with either the notch 47 or 48, while the embodiment as shown in FIG. 14 may be merely provided with either the notch 51 or 52.

The embodiment as shown in FIG. 15 is adapted not to reduce the inductance obtained by its inductance elements while permitting increase in the electrostatic capacitance of a its capacitor element; or not to reduce its electrostatic capacitance while increasing its inductance. This embodiment employs a central conductor 11a, which is independently shown in FIG. 16.

A relatively large diameter portion 54 and relatively small diameter portions 55 and 56 are distributed along the longitudinal direction of the central conductor 11a. As shown in FIG. 15, a cylindrical capacitor 57 is arranged on the large diameter portion 54. Cylindrical magnetic elements 58 and 59 are arranged on the small diameter portions 55 and 56 respectively.

The cylindrical capacitor 57 is provided with a cylindrical dielectric member 60, a first terminal electrode 61 formed on the outer peripheral surface thereof and a second terminal electrode 62 formed on the inner peripheral surface thereof. The second terminal electrode 62 is electrically connected to the central conductor 11a with solder 63.

After the magnetic elements 58 and 59 are arranged on the small diameter portions 55 and 56, first and second ring-shaped members 64 and 65 serving as first and second external terminal means are fitted onto both end portions of the central conductor 11a respectively. The ring-shaped members 64 and 65 are electrically connected with and mechanically fixed to the central conductor 11a in a similar manner to that in the embodiment as shown in FIG. 2.

As seen in FIG. 15, the dielectric member 60 of the cylindrical capacitor 57 can be made relatively smaller in thickness than the magnetic elements 58 and 59. Therefore, the inductance obtained by the magnetic elements 58 and 59 can be increased while also increasing the electrostatic capacitance obtained by the cylindrical capacitor 57.

As clearly shown in FIG. 16, tapered surfaces 66 and 67 are provided on both ends of the large diameter portion 54. Such tapered surfaces 66 and 67 are adapted to facilitate mounting of the cylindrical capacitor 57 on the large diameter portion 54. By virtue of the tapered surfaces 66 and 67, further, relatively wide clearances 68 and 69 are defined between the central conductor 11a, the cylindrical capacitor 57 and the magnetic elements 58 and 59. Even if solder 63 is remelted by heat applied to solder the chip-like LC filter as shown in the figure on a circuit board (not shown), such molten solder 63 will remain in the clearances 68 and 69. Thus, even if the solder 63 is melted enough to flow out, the solder is reliably prevented from reaching the first terminal electrode 61.

In the aforementioned embodiment, the number of the relatively large diameter portion and the relatively small diameter portion may be changed, and they may be distributed in various ways along the longitudinal direction of the central conductor to obtain various mode of arrangement in which various numbers and distributions of capacitor elements and magnetic elements are employed.

FIG. 17 illustrates a central conductor 11b which can be employed in place of the central conductor 11a as shown in FIG. 15. A relatively large diameter portion of the central conductor 11b is formed by a resilient elastic contact member 70. The elastic contact member 70 is integrally formed with the central conductor 11b, and a method of such formation is disclosed in U.S. Pat. No. 3,634,819, for example. When such a central conductor 11b is employed, the elastic contact member 70 thereof comes into pressure contact with the inner terminal electrode 62 of the cylindrical capacitor 57 as shown in FIG. 15 by its elasticity, thereby to electrically connect and mechanically fix the cylindrical capacitor 57 to the central conductor 11b without employing solder.

The central conductor having an elastic contact member as shown in FIG. 17 may be applied to the embodiment as shown in FIG. 2 and the like by changing the diametrical size of the elastic contact member.

In place of the elastic contact member 70 as shown in FIG. 17, the outer peripheral surface of a relatively large diameter portion of a central conductor may be worked by a knurling tool for example, so that the surface thus formed may be brought into pressure contact with a terminal electrode in the inner peripheral side of a cylindrical capacitor.

Figure 18:
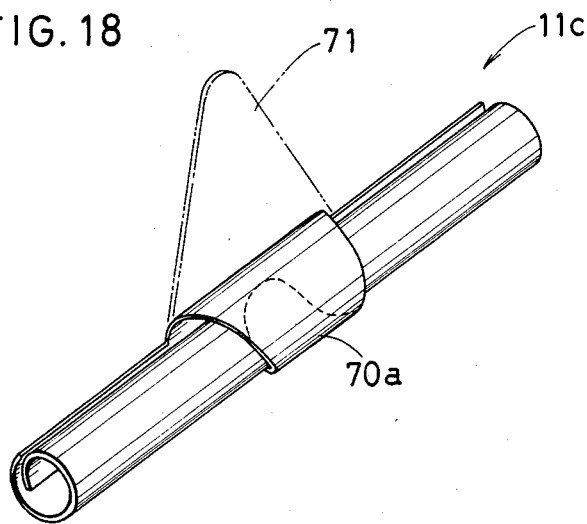
FIG. 18 is a perspective view showing a central conductor employed in a further embodiment of the present invention.

FIG. 18 shows a central conductor having an elastic contact portion for performing a similar function to that of the elastic contact portion 70 as shown in FIG. 17. Referring to FIG. 18, a central conductor 11c is basically obtained by rolling a metal plate of, for example, about 0.05 to 0.08 mm in thickness. The metal plate for forming the central conductor 11c is substantially in a T-shaped configuration when unrolled. Employing such a T-shaped metal plate, first a horizontally extending portion is rolled and then a vertically extending portion 71 is rolled thereon as shown by phantom lines in FIG. 18. In the rolled state as shown by solid lines in FIG. 18, therefore, the said vertically extending portion 71 forms an elastic contact portion 70a, which also is a relatively large diameter portion.

Figure 19:
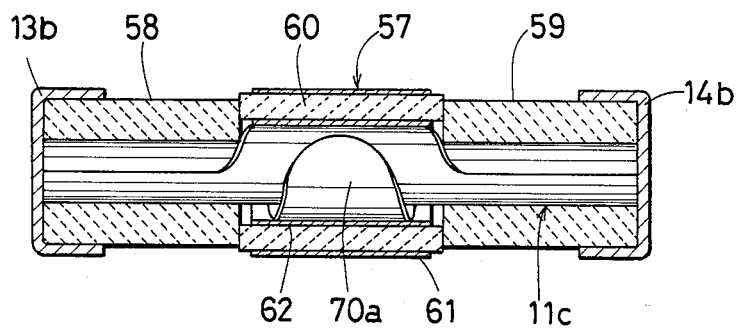
FIG. 19 is a longitudinal cross-sectional view of a chip-like LC filter taken through the central conductor as shown in FIG. 18.

FIG. 19 shows an LC filter which include the central conductor 11c a shown in FIG. 18. Referring to FIG. 19, parts corresponding to those shown in FIG. 15 are indicated by the same reference numerals, to avoid redundant description. In the embodiment as shown in FIG. 19, cap-shaped members 13b and 14b are employed as external terminal means, similarly to the embodiment as shown in FIG. 6. These cap-shaped members 13b and 14b are coupled with the central electrode 11c by resistance welding for example, although the manner of such coupling is not shown in figure. Similarly to those in the embodiment of FIG. 6, the cap-shaped members 13b and 14b are arranged to partially cover magnetic elements 58 and 59 provided on both end portions of the central conductor 11c, whereby the magnetic elements 58 and 59 are made smaller in outer diameter than a cylindrical capacitor 57 by an amount corresponding to the thickness of the cap-shaped members 13b and 14b.

In the embodiment as shown in FIG. 19, the elastic contact portion 70a exerts elasticity to come into pressure contact with an inner terminal electrode 62 of the cylindrical capacitor 57, whereby the cylindrical capacitor 57 can be electrically connected with and mechanically fixed to the central conductor 11c without employing solder. In the embodiment as shown in FIG. 19, along the entire longitudinal direction extent of the central conductor 11c, to hold the magnetic elements 58 and 59 in prescribed positions on the central conductor 11c before the cap-shaped members 13b and 14b are provided.

While embodiments of the present invention have been described with reference to the drawings, the following modifications are also applicable within the scope of the present invention.

With reference to FIG. 2, for example, the ring-shaped members 13 and 14 may be previously formed with solder films through solder plating or the like, if necessary.

Electrode films of silver etc. may be formed on respective end surfaces of the magnetic elements 2 and 3 as external terminal means in place of the ring-shaped members 13 and 14 as shown in FIG. 2 for example, so that the electrode films are electrically connected to the central conductor 11.

Although the terminal electrode 10 is electrically connected with the central conductor 11 with the solder 12 in the embodiment as shown in FIG. 2 for example, a conductive adhesive agent may be employed in place of the solder 12.

The aforementioned embodiments have been adapted to form the so-called T-type filter circuit as shown in FIG. 3, the so-called L-type filter circuit as shown in FIG. 7, or the so-called π-type filter circuit as shown in FIG. 8. However, the numbers of the magnetic element(s) and the capacitor element(s) employed in a single chip-like LC filter, and the ways these elements are combined can be arbitrarily selected, so it is possible to arbitrarily obtain any LC filter other than the equivalent circuits as shown in FIGS. 3, 7 and 8.

Further, the magnetic elements, the capacitor element, the central conductor and the like may be in arbitrary configuration and size. For example, the magnetic elements and the capacitor element may be angular in section.

In addition, the LC filter according to the present invention is not restricted to a noise filter.

Although the present invention has been described and illustrated in detail by embodiments thereof, it is clearly understood that the same is by way of illustration and example only and is not to be taken by way of limitation, the spirit and scope of the present invention being limited only by the terms of the appended claims.

What is claimed is:

1. A chip-like leadless LC filter comprising:

a pair of magnetic elements, each element having a first through hole defining and extending along an axial direction thereof;

a capacitor element provided with a first terminal electrode formed on an outer peripheral surface thereof, a second through hole extending along the axial direction thereof, and a second terminal electrode formed on an inner peripheral surface defining said second through hole;

a central conductor inserted in said first and second through holes to retain said magnetic elements and said capacitor element in an axially aligned state, wherein one said magnetic element, said capacitor element and the other said magnetic element are arranged in this sequence on said central conductor; said central conductor being electrically connected with said second terminal electrode of said capacitor element; and first and second external terminal means respectively provided on respective end portions along said axial direction of said central conductor, wherein said first and second external terminal means respectively comprise first and second conductive cap-shaped members which have peripheral flange portions partially covering the axial ends of said magnetic elements at each end portion of said central conductor, said cap-shaped members being electrically connected with said central conductor at said end portions thereof;

wherein said first terminal electrode and said first and second external terminal means have outer peripheral surfaces which are aligned to define a substantially cylindrical outer peripheral shape of said filter;

whereby the leadless chip-like LC filter may be placed on a plane surface with only the peripheral flange portions of said cap-shaped members, and the first terminal electrode of the capacitor element, being in contact with said plane surface.

2. A chip-like LC filter in accordance with claim 1, wherin said magnetic elements and said capacitor element are in the form of cylinders, said first and second through holes are circular in cross-section and said central conductor is in the form of a rod with a circular cross section.

3. A chip-like LC filter in accordance with claim 1, wherein said central conductor is provided along at least part of its axial length with conductive elastic contact means for elastically bearing against said second terminal electrode to make electrical contact between said central conductor and said capacitor element.

4. A chip-like LC filter in accordance with claim 1, wherein said capacitor element forms electrostatic capacitance between said first and second terminal electrodes.

5. A chip-like LC filter in accordance with claim 1, wherein said second terminal electrode and said central conductor are soldered to each other.

6. A chip-like LC filter in accordance with claim 5, wherein at least one clearance for partially exposing said central conductor is defined between at least one end surface at an axial end of said capacitor element and an adjoining magnetic element.

7. A chip-like LC filter in accordance with claim 6, wherein said clearance is formed by a notch provided in said at least one of said end surfaces of said capacitor element.

8. A chip-like LC filter in accordance with claim 6, wherein said clearance is formed by a notch provided on an end surface at an axial end of said magnetic element adjacent to said capacitor element.

9. A chip-like LC filter in accordance with claim 1, wherein said central conductor has a relatively large diameter portion and a relatively small diameter portion distributed along the axial direction of said central conductor and said capacitor element is located radially adjacent to said large diameter portion and said magnetic element is located radially adjacent to said small diameter portion.

10. A chip-like LC filter in accordance with claim 9, wherein a tapered conical surface is formed on at least one end portion at an axial end of said large diameter portion interconnecting said large diameter portion and an adjacent small diameter portion.

11. A chip-like LC filter in accordance with claim 1, wherein each said magnetic element and each said flange portion has a respective outer diameter, the outer diameters of the magnetic elements being less than the outer diameters of the flange portions by an amount substantially equal to the thickness of the flange portions.

12. In combination,
a printed circuit board having a circuit pattern printed thereon which includes a plurality of printed conductors; and
a chip-like leadless LC filter comprising:
a pair of magnetic elements, each element having a first through hole defining and extending along an axial direction thereof;
a capacitor element provided with a first terminal electrode formed on an outer peripheral surface thereof, a second through hole extending along the axial direction thereof, and a second terminal electrode formed on an inner peripheral surface defining said second through hole;
a central conductor inserted in said first and second through holes to retain said magnetic elements and said capacitor element in an axially aligned state, wherein one said magnetic element, said capacitor element and the other said magnetic element are arranged in this sequence on said central conductor; said central conductor being electrically connected with said second terminal electrode of said capacitor element; and
first and second external terminal means respectively provided on respective end portions along said axial direction of said central conductor, wherein said first and second external terminal means respectively comprise first and second conductive cap-shaped members which have peripheral flange portions partially covering the axial ends of said magnetic elements at each end portion of said central conductor, said cap-shaped members being electrically connected with said central conductor at said end portions thereof;
wherein said first terminal electrode and said first and second external terminal means have outer peripheral surfaces which are aligned to define a substantially cylindrical outer peripheral shape of said filter;
whereby the leadless chip-like LC filter may be placed on a plane surface with only the peripheral flange portions of said cap-shaped members, and the first terminal electrode of the capacitor element, being in contact with said plane surface;
wherein the respective peripheral flange portion of one of said cap-shaped members is directly conductively secured to a conductor on said printed circuit board, and the first terminal electrode of the capacitor element is directly conductively secured to a conductor on said printed circuit board.

13. A combination as in claim 21, wherein said respective peripheral flange portion and said first terminal electrode are each secured to a respective conductor of said printed circuit pattern.

* * * * *